United States Patent [19]
Fujita et al.

[11] Patent Number: 5,286,712
[45] Date of Patent: Feb. 15, 1994

[54] HIGH TC SUPERCONDUCTING FILM

[75] Inventors: Nobuhiko Fujita; Tadakazu Kobayashi; Hideo Itozaki; Saburo Tanaka; Shuji Yazu; Tetsuji Jodai, all of Hyogo, Japan

[73] Assignee: Sumitomo Electric Industries, Ltd., Osaka, Japan

[21] Appl. No.: 953,861

[22] Filed: Sep. 30, 1992

Related U.S. Application Data

[60] Division of Ser. No. 563,687, Aug. 3, 1990, Pat. No. 5,175,140, which is a continuation of Ser. No. 171,359, Mar. 21, 1988, abandoned.

[30] Foreign Application Priority Data

Mar. 19, 1987 [JP] Japan .................. 62-65281

[51] Int. Cl.$^5$ ........................... H01L 39/00
[52] U.S. Cl. .................... 505/1; 505/701; 505/731; 505/732; 428/930; 428/702; 428/688; 427/62
[58] Field of Search .............. 505/1, 701, 702, 731, 505/732; 427/62, 63, 126.3, 529; 204/192.24; 252/521; 428/930, 702, 688

[56] References Cited

U.S. PATENT DOCUMENTS

| | | | |
|---|---|---|---|
| 4,316,785 | 2/1982 | Suzuki et al. | 204/192 |
| 4,880,773 | 11/1989 | Itozaki et al. | 505/001 |
| 4,952,555 | 8/1990 | Sibata et al. | 505/001 |

OTHER PUBLICATIONS

Hasegawa et al, "High $T_c$ Superconductivity of (La$_{1-x}$Sr$_x$)CuO$_4$ -Effect of Substitution of Foreign Ions for Cu and La on Superconductivity", *Jpn. J. Appl. Phys* 26 (Mar. 1987) pp. 337-338.

Cava et al, "Bulk Superconductivity at 36 K in La$_{1.8}$Sr$_{0.2}$CuO$_4$", *Physical Review Letters*, vol. 58, No. 4 (Jan. 1987) pp. 408-410.

Hammond, "Synthesis and physical properties of superconducting compound films formed by the electron-beam codeposition of the elements", *J. Vac. Sci. Technol.*, 15(2) (Mar./Apr. 1978) pp. 382-385.

Bunshah et al, "Deposition Technologies for Films and Coatings", *Noyes Publications*, Park Ridge, NJ, USA, 1982, pp. 83-237.

Xin et al, "A Study of Superconducting Oxide Y-Ba-Cu-Sn-O", *International Journal of Modern Physics B*, vol. 1, No. 2(Jun. 1987) pp. 277-280.

Hor et al, "Superconductivity at 93 K in a New Mixed-Phase Y-Ba-Cu-O Compound System at Ambient Pressure", *Physical Review Letters*, vol. 58, No. 9 (Mar. 1987) pp. 908-910.

Bednorz et al, "Possible High Tc Superconductivity in the Ba-La-Cu-O System", *Z. Phys. B-Condensed Matter*, 64 (1986) pp. 189-193.

*Primary Examiner*—Roy King
*Attorney, Agent, or Firm*—Foley & Lardner

[57] ABSTRACT

This invention relates to new superconducting material having a composition represented by the general formula:

$$A_u B_v C_w D_x E_y$$

in which,
"A" represents one element selected from a group consisting of IIa group and IIIa group of the Periodic Table,
"B" represents one element selected from a group consisting of IIa group and IIIa group of the Periodic Table and may be same as "A",
"C" represents at least one element selected from a group consisting of vanadium (V), tantalum (Ta), niobium (Nb), chromium (Cr), gallium (Ga), indium (In), cadmium (Cd), tin (Sn), thallium (Tl), lead (Pb), molybdenum (Mo), tungsten (W) and zinc (Zn),
"D" represents one element selected from a group consisting of Ib group, IIb group, IIIb group and VIII group of the Periodic Table,
"E" represents at least one element selected from a group consisting of oxygen (O), boron (B), carbon (C), nitrogen (N), fluorine (F) and sulfur (S), and
each of "u", "v", "w" and "x" represent a number selected in a range of from 0 to 1, and "y" represent a number which is selected from a range of from 1 to 4. The superconducting material may be perovskite type oxide.

12 Claims, 2 Drawing Sheets

HIGH TC SUPERCONDUCTING FILM

This application is a division, of application Ser. No. 07/563,687, filed Aug. 3, 1990, now U.S. Pat. No. 5,175,140, which is a continuation of application Ser. No. 07/171,359 filed Mar. 21, 1988, now abandoned.

BACKGROUND OF THE INVENTION

1. Field of the Invention

The present invention relates to superconducting material, more particularly, it relates to a new superconducting material which possesses a higher critical temperature of superconductivity and a reduced discrepancy between the critical temperature and the onset temperature where the phenomenon of superconductivity is initially observed and which show enough stability in superconducting properties, as well as a process for preparing the same in a form of a block or in a form of a thin film.

2. Description of the related art

Under the superconducting condition, the perfect diamagnetism is observed and no difference in potential is observed for an electric current of a constant finite value, and hence, a variety of applications of superconductivity have been proposed in a field of electric power transmission as a means for delivering electric power without loss.

The superconductivity can be utilized in the field of electric power applications such as MHD power generation, power transmission, electric power reservation or the like; in the field of transportation, for example magnetic levitation trains, or magnetically propelling ships; in the medical field such as high-energy beam radiation unit; in the field of science such as NMR or high-energy physics; high sensitive sensors or detectors for sensing very weak magnetic field, microwave, radiant ray or the like, or in the field of fusion power generation.

In addition to the abovementioned electric power applications, the superconducting materials can be used in the field of electronics, for example, as a Josephson device which is an indispensable switching device for realizing a high-speed computer which consumes very reduced power.

However, their actual usage has been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of Nb$_3$Ge which showed the highest Tc could not exceed 23.2 K. at most. This means that liquidized helium (boiling point of 4.2 K.) is only one cryogen which can realize such very low temperature of Tc. However, helium is not only a limited costly resource but also requires a large-scaled system for liquefaction. Therefore, there has been a strong demand for other superconducting materials having higher Tc. However no material which exceeded the abovementioned Tc had been found from studies over the past ten years.

The possibility of an existence of new types of superconducting materials having much higher Tc was revealed by Bednorz and Muller, who discovered a new oxide type superconductor in 1986 [Z. Phys. B64 (1986) 189]

This new oxide type superconducting material is [La, Ba]$_2$CuO$_4$ or [La, Sr]$_2$CuO$_4$ which are called the K$_2$NiF$_4$-type oxides having a crystal structure which is similar to known perovskite type oxide. The K$_2$NiF$_4$-type oxides show such higher Tc as 30 to 50 K., which are extremely higher than the known superconducting materials, and hence it becomes possible to use liquidized hydrogen (b.p.=20.4 K.) or liquidized neon (b.p.=27.3 K.) as a cryogen which can bring them to exhibit the superconductivity.

It was also reported that C. W. Chu et al discovered, in the United States of America, another type of superconducting material having the critical temperature of in the order of 90 K. in February 1987, and hence the possibility of existence of high-temperature superconductors have burst onto the scene.

Generally, in the case of the abovementioned superconducting materials, there is a large discrepancy or difference between the onset temperature "Tc" (from where superconducting phenomenon started to be observed) and the critical temperature "Tcf" (from where resistivity vanishes completely and hence the complete superconductivity is realized). Therefore, in a practical use, these superconductors must be cooled down to a temperature which is fairly lower than the onset temperature "Tc", it is requested to reduce the abovementioned discrepancy or difference between "Tc" and "Tcf".

Furthermore, superconductivity breaks down in a strong magnetic field. The critical field "Hc" which is a definite value of magnetic field from where superconductivity breaks is dependent on temperature. Specifically both the critical temperature "Tc" and the critical magnetic field "Hc" are critical factors when superconductors are applied for practical uses. Therefore, it is also requested to improve the stability of superconductivity at the critical magnetic field.

The inventors of the present invention tried to solve the abovementioned problems by adding additional elements to the room-temperature superconductors which were discovered recently. It was expected that the addition of specified elements would improve a variety of properties of the superconducting materials so as to obtain higher critical current density and the stability of the critical current density under a strong magnetic field.

Experiments carried out by the present inventors revealed that the addition of one or more than one elements selected from a group consisting of V, Ta, Nb, Cr, Ga, In, Cd, Sn, Tl, Pb, Mo, W and Zn, to the compound oxide type superconducting materials, bring improvement in the properties of superconductivity, so as to obtain superconducting materials which exhibit a reduced discrepancy or difference between "Tc" and "Tcf" and whose superconductivity is not broken under stronger magnetic field. Therefore, an object of the present invention is to solve the abovementioned problems and to provide a new superconducting material which exhibits a reduced discrepancy or difference between "Tc" and "Tcf" and whose superconductivity is not broken under stronger magnetic field, as well as to provide a process for producing the same in the form of bulk or block and in the form of a thin film.

SUMMARY OF THE INVENTION

The present invention provides superconducting material having a composition represented by the general formula:

in which,

"A" represents one element selected from a group consisting of elements of IIa group and IIIa group of the Periodic Table, "B" represents one element selected from a group consisting of elements of IIa group and IIIa group of the Periodic Table, and may be same as "A", "C" represents at least one element selected from a group consisting of vanadium (V), tantalum (Ta), niobium (Nb), chromium (Cr), gallium (Ga), indium (In), cadmium (Cd), tin (Sn), thallium (Tl), lead (Pb), molybdenum (Mo), tungsten (W) and zinc (Zn), "D" represents one element selected from a group consisting of elements of Ib group, IIb group, IIIb group and VIII group of the Periodic Table, and "E" represents at least one element selected from a group consisting of oxygen (O), boron (B), carbon (C), nitrogen (N), fluorine (F) and sulfur (S), and each of "u", "v", "w" and "x" represent a number selected in a range of 0 to 1, and "y" represents a number which is selected from a range of 1 to 4.

Generally, the element "E" in the formula is oxygen (O). But, a portion of the oxygen may be substituted by the other element or elements selected from a group consisting of boron (B), carbon (C), nitrogen (N), fluorine (F) and sulfur (S).

Generally, the element "D" is copper (Cu). However, a portion of the copper may be substituted by the other element or elements selected from a group consisting of Ib group, IIb group, IIIb group and VIII group of the Periodic Table, for example titanium (Ti).

Generally, the element "A" is one element selected from elements of IIa group of the Periodic Table, while the element "B" is one element selected from IIIa group of the Periodic Table. As preferred combination of the element "A" and the element "B", it can be mentioned a combination of Ba and Y and a combination of Sr and La. A portion of the Ba and/or Y, or of Sr and/or La may be substituted by the other element or elements selected from elements of IIa group and IIIa group of the Periodic Table such as calcium (Ca).

The atom ratio of the elements of "A", "B", "C" and "D", namely the values of "u", "v", "w" and "x" in the formula, is selected in a range of 0 to 1 respectively. Under this condition, the value of "y" is selected from a range of 1 to 4.

For example, in the case of a compound oxide of elements of Ba, Y, Cu and "D", the atom ratio of Ba:Y:Cu:"D" is preferably selected in a range of (0.5 to 2):(0.5 to 3):(1 to 4):(0.01 to 0.1). The compound oxide preferably contains perovskite type oxide or quasi-perovskite type oxide. The term quasi-perovskite type oxide means a structure which can be considered to have such a crystal structure that is similar to perovskite-type oxides and includes an orthorhombically distorted perovskite or a distorted oxygen-deficient perovskite or the like.

The present invention also provides a process for producing the abovementioned superconducting material, characterized by sintering a mixture of the following powders:

an oxide, carbonate, nitrate or sulfate of one element "A" selected from a group consisting of elements of IIa group and IIIa group of the Periodic Table, an oxide, carbonate, nitrate or sulfate of one element "B" selected from a group consisting of elements of IIa group and IIIa group of the Periodic Table and may be the same as "A", an oxide, carbonate, nitrate or sulfate of at least one element "C" selected from a group consisting of vanadium (V), tantalum (Ta), niobium (Nb), chromium (Cr), a gallium (Ga), indium (In), cadmium (Cd), tin (Sn), thallium (Tl), lead (Pb), molybdenum (Mo), tungsten (W) and zinc (Zn), and an oxide, carbonate, nitrate or sulfate of one element "D" selected from a group consisting of elements of Ib group, IIb group, IIIb group and VIII group of the Periodic Table, wherein, the atom ratio of said these elements "A":"B":"C":"D" in the mixture of powders being adjusted to (0 to 1):(0 to 1):(0 to 1):(0 to 1).

Selection of the starting materials or the elements of "A", "B", "C" and "D" and the preferred atom ratio thereof may be effected in the same manner as the abovementioned description.

The compound oxide of the elements of "A", "B", "C" and, "D" is produced by the abovementioned sintering. Specifically oxygen (O) is introduced into the sintered mass. The other elements selected from the abovementioned elements "E" can be introduced into the sintered mass of the compound oxide if the sintering is carried out under the presence of these elements "E". In practice, powders of nitrides of boron and/or carbon, fluorides and/or sulfates of the abovementioned the other elements of "A", "B" and "C" may be mixed in the starting material powders. It is also possible to introduce a gas or gasses of the elements "E" or halogenated compound gas into the sintering atmosphere directly.

According to a preferred embodiment of the present invention, powders of oxides, carbonates, nitrates or sulfates of elements of Ba, Y, Cu and the element "C" are mixed with such proportions that the atom ratio of Ba:Y:Cu:"C" is selected in a range of (0.5 to 2):(0.5 to 3):(1 to 4):(0.01 to 0.1).

The sintering can be carried out at a temperature ranging from 700° C. to 1,600° C., preferably from 800° C. to 1,000° C. This sintering operation is preferably carried out through at least two stages including a preliminary sintering of the mixture of powders, and a final sintering comprising pulverizing at the preliminary sintered body, compacting the pulverized powder and finally sintering the compacted powder. The preliminary sintering may be carried out at a temperature ranging from 550° C. to 950° C., and the final sintering may be carried out at a temperature ranging from 800° C. to 930° C.

It is also preferable to heat-treat the resulting sintered body further. This heat-treatment may be carried out at a temperature ranging from 750° to 1,500° C., preferably at a temperature ranging from 750° to 930° C.

The present invention also provides a method for producing a superconducting thin film by a physical vapor deposition technique, characterized in that a target used in the physical vapor deposition technique is a compound oxide which contains one element "A" selected from a group consisting of elements of IIa group and IIIa group of the Periodic Table, one element "B" selected from a group consisting of elements of IIa group and IIIa group of the Periodic Table and may be same as "A", at least one element "C" selected from a group consisting of vanadium (V), tantalum (Ta), niobium (Nb), chromium (Cr), gallium (Ga), indium (In), cadmium (Cd), tin (Sn), thallium (Tl), lead (Pb), molybdenum (Mo), tungsten (W) and zinc (Zn), and one element "D" selected from a group consisting of elements of Ib group, IIb group, IIIb group and VIII group of the Periodic Table, the atom ratio of said elements of "A", "B", "C" and "D" is adjusted to such a range that the atom ratio of "A":"B":"C":"D" in the target is (0 to 1):(0 to 1):(0 to 1):(0 to 1) in order to produce a thin film of perovskite type oxide or quasi-perovskite type oxide.

The target itself is preferably made of perovskite type oxide or quasi-perovskite type oxide.

According to the preferred embodiment, the element "A" is barium (Ba), the element "B" is yttrium (Y) and the element "D" is copper (Cu). In this case, the target may be prepared from a preliminary sintered mass which is produced by preliminary sintering a mixture of powders of oxides, carbonates, nitrates or sulfates of said elements of Ba, Y, Cu and said element "C" which are mixed with such proportions that the atom ratio of Ba:Y:Cu:"C" is selected in a range of (0.5 to 2):(0.5 to 3):(1 to 4):(0.01 to 0.1) at a temperature ranging from 250° to 1,200° C. The term preliminary sintering means that powder material is subjected to heat-treatment or calicinated or sintered to produce a compound oxide.

It is also possible to use, as the target, a finally sintered mass which is produced by further sintering said preliminary sintered mass at a temperature ranging from 700° to 1,000° C.

The target may be in form of powder prepared from the preliminary sintered mass or the finally sintered mass, or in form of a block of the preliminary sintered mass or the finally sintered mass. It is also possible to use, as the target, a plurality of target segments each of which may be an oxide of Ba, Y, Cu and the element "D" respectively or for example, of a combination of $(Ba, Y)O_x$ and CuO, wherein "x" represents a number of $1 \leq x$.

The atom ratio of Ba, Y, Cu and the element "D" in the target can be adjusted in the function of evaporation rates of Ba, Y, Cu and the element "C" on the basis of the atom ratio of Ba, Y, Cu and the element "C" in a thin film to be produced.

Generally, an atmosphere of vaporization contains Ar and $O_2$, the partial pressure of Ar is preferably adjusted in a range from $1.0 \times 10^{-3}$ to $3 \times 10^{-1}$ Torr, preferably $5.0 \times 10^{-3}$ to $3 \times 10^{-1}$ Torr, while the partial pressure of $O_2$ is preferably adjusted in a range from $1.0 \times 10^{-3}$ to $3 \times 10^{-1}$ Torr. When the partial pressure of Ar exceeds $3 \times 10^{-1}$ Torr, glow discharge occurs, so that deposition of oxide which exhibits a desired superconducting property can not be obtained. If the partial pressure of $O_2$ is not higher than $1.0 \times 10^{-3}$, the resulting thin film does not contain a satisfactory amount of perovskite type oxide or quasi-perovskite type oxide because of poor crystal structure. When the partial pressure of $O_2$ exceeds $3 \times 10^{-1}$ Torr, the deposition rate becomes too slow to produce the thin film in a industrial scale.

The physical vapor deposition can be performed by sputtering, ion plating, vacuum deposition, ion beam deposition or molecular beam deposition techniques, but high-frequency (RF) sputtering technique, more particularly, magnetron sputtering is most preferable. The power of the high-frequency is preferably less than 104 W/cm$^{-2}$, preferably less than 15 W/cm$^{-2}$. In the case of RF sputtering, the speed or rate of deposition increases with and increase of the high-frequency power. However, if the high-frequency power exceeds 115 W/cm$^{-2}$, arc discharge or abnormal discharge is apt to occur. Therefore, the high-frequency power which is less than 115 W/cm$^{-2}$, preferably less than 15 W/cm$^{-2}$, was used in the present invention.

The distance between a substrate and the target is preferably adjusted at a value from 3 to 300 mm, preferably from 15 to 300 mm. When the distance is too small, it is difficult to produce plasma between the substrate and the target. Particularly, in the case of the high-frequency magnetron sputtering technique, the plasma is converged or concentrated in the neighborhood of a magnet positioned behind the target, uniform deposition of the thin film cannot be produced if the distance between the substrate and the target is too small. Therefore, the distance must be larger than the predetermined minimum value. To the contrary, when the distance between the substrate and the target is too large, the deposition rate become too slow to effect practical deposition. Therefore, the distance is preferably adjusted from 3 mm to 300 mm, preferably from 15 mm to 300 mm.

The substrate on which the thin film is deposited is preferably heated by a heater at a temperature ranging from 260° C. to 1,500° C. during the sputtering operation.

It is also preferable to heat the obtained thin film additionally. An object of the heat-treatment is to homogenize the composition of the deposited thin film and to obtain the proper perovskite type oxide or quasi-perovskite type oxide. If the temperature of the heat-treatment is not higher than 750° C., it is difficult to obtain the objective perovskite type oxide or quasi-perovskite type oxide which possesses the desired critical temperature of superconductivity or it takes extremely longer time to complete the heat-treatment. To the contrary, if the temperature of the heat-treatment exceeds 1,500° C., the objective perovskite type oxide or quasi-perovskite type oxide is exhausted or disappears resulting in the lowering of the critical temperature.

The substrate may be made of any one of materials which are used in the field of the physical vapor deposition and may be selected from glass, quartz, silicon, stainless steel and ceramics such as MgO, $BaTiO_3$, sapphire, YSZ or the like.

The target according to the present invention can be also used in the ion plating technique in which an ion beam from an electron gun is directed onto the target.

The present invention provides a new superconducting material having very high Tc which permits the use of liquidized hydrogen or neon which are available cheaply and hence to enlarge the applications of superconductivity.

The sintered block obtained by the process of the present invention can be machined or molded into desired shapes and dimensions, so that a variety of superconducting products, such as a magnetic coil used under higher magnetic fields, a superconducting wire, a main part of superconducting power reservation or the like can be produced by adopting known technology used in the field of powder sintering.

The superconducting thin film prepared by the present invention can be utilized advantageously in the field of microelectronics, as Josephson device, SQUID (Superconducting Quantum Interference Device), infrared sensor or the like.

Now, an apparatus which can be used to realize the abovementioned process according to the present invention will be described with reference to be attached drawings which are not limitative of the present invention.

DESCRIPTION OF PREFERRED EMBODIMENTS

Figure 1:
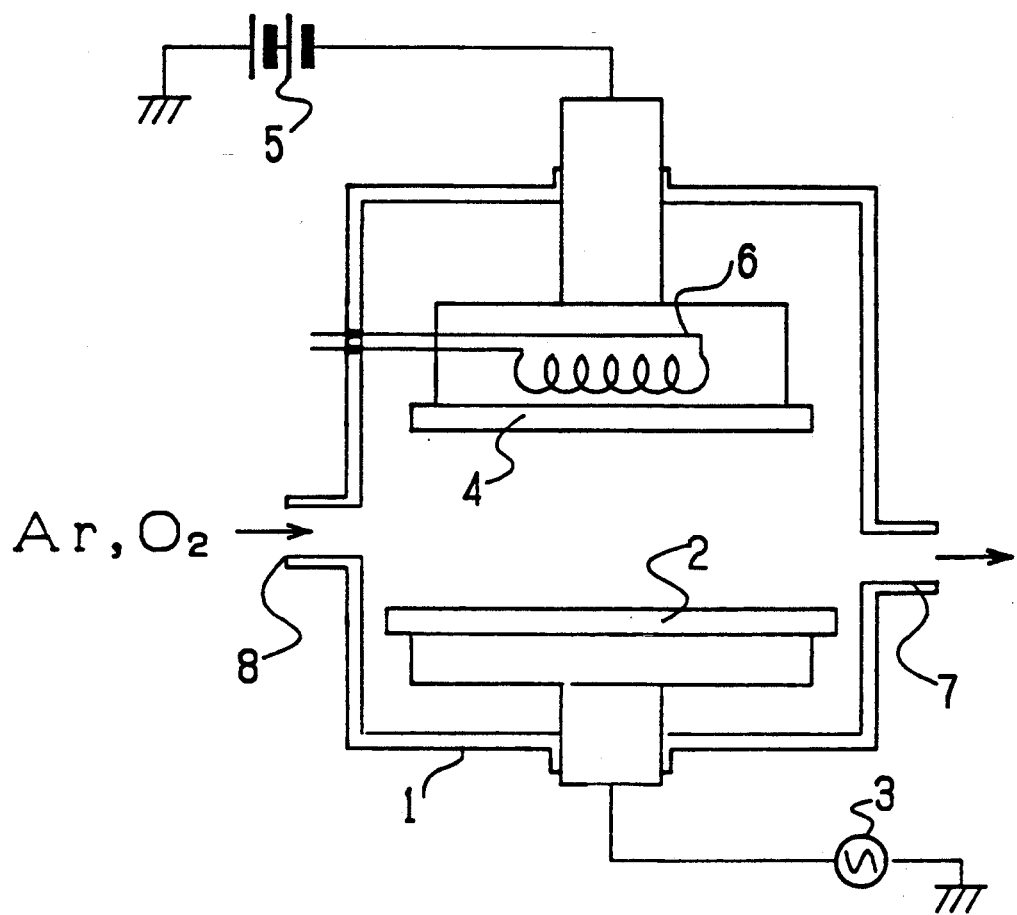
FIG. 1 illustrates an example of an sputtering machine which can be used to carry out the process of the present invention.

An apparatus illustrated in FIG. 1 shows a sputtering machine which is used for carrying out the process according to the present invention and includes a vacuum chamber or bell jar 1, a material target 2 placed in the vacuum chamber 1, a high-frequency power source 3 connected to the target 2, and a substrate 4 on which the thin film is deposited and being faced to the target 2. A vacuum pump (not shown) connected through a port 7 to the interior of the chamber 1 functions to create vacuum therein.

Bias voltage is impressed on the substrate 4 from a source of high-voltage 5. The substrate 4 is heated by a heater 6 so that the temperature of the substrate is adjustable. The bell jar 1 has a gas inlet 8 for introducing argon gas.

Figure 2:
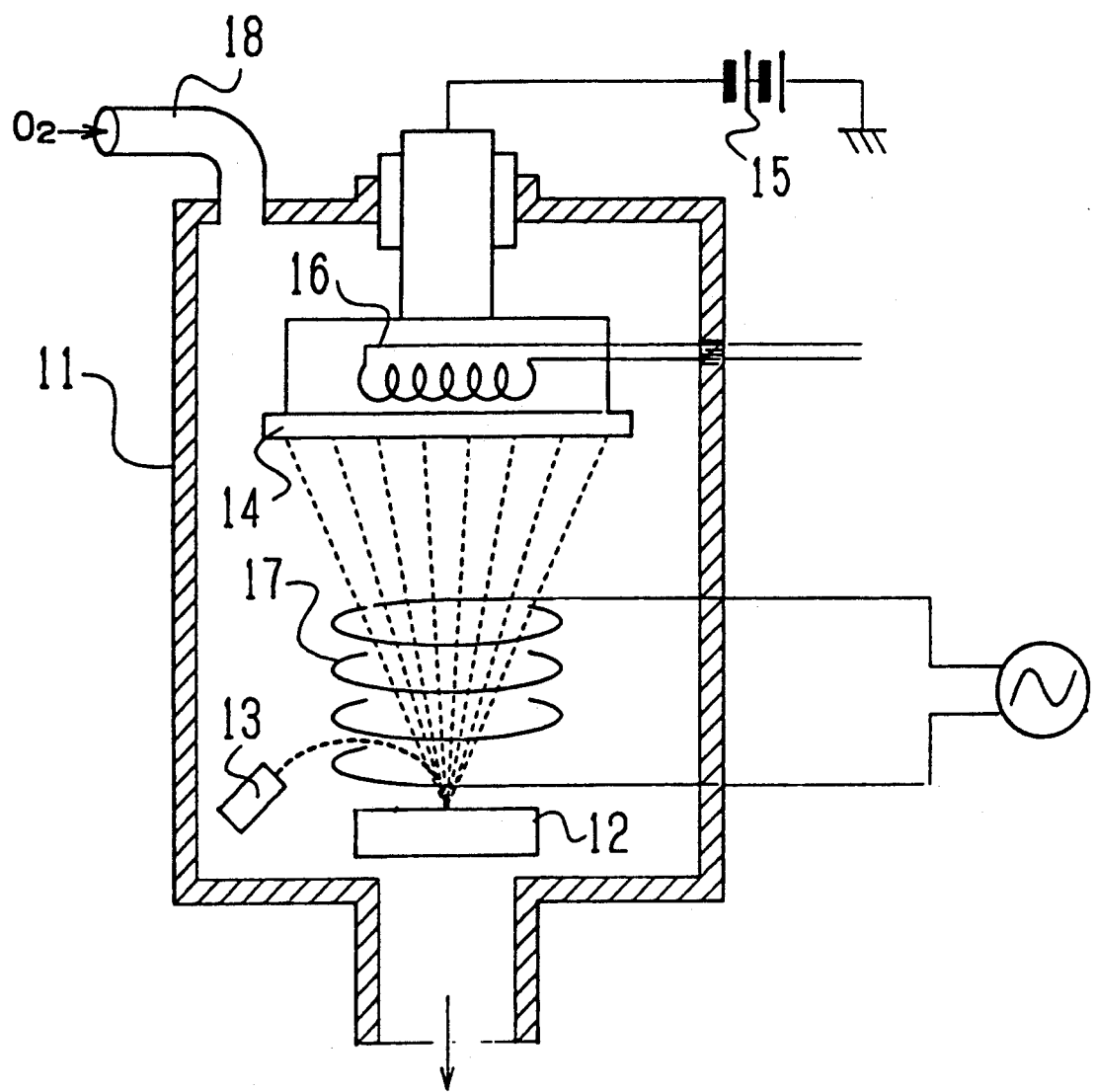
FIG. 2 shows an illustrative cross section of an embodiment of an ion plating machine which can be used in the process according to the present invention.

An apparatus illustrated in FIG. 2 shows a high-frequency excitation type ion plating machine which can be used for carrying out the process according to the present invention and includes a vacuum chamber or bell jar 11, a material target 12 placed in the vacuum chamber 11, an electron gun 13 placed in the neighborhood of the target 12 for melting and evaporating material of the target 12, and a substrate 14 on which the thin film is deposited and being faced to the target 12. A vacuum pump (not shown) connected to the interior of the chamber 11 functions to create vacuum therein.

Bias voltage is impressed on the substrate 14 from a source of high-voltage 15. The substrate 14 is heated by a heater 16 so that the temperature of the substrate is adjustable. A high-frequency coil 17 is arranged in the bell jar 11 between the target 12 and the substrate 14 in such a manner that evaporated particles are enclosed by the coil. The bell jar 11 has a gas inlet 18 for introducing oxygen gas.

Now, embodiments of the process according to the present invention will be described with reference to illustrative Examples, but the scope of the present invention should not be limited thereto.

EXAMPLE 1

Into a mixture of 59.0 g of $BaCO_3$ powder of purity of 99.9%, 45.0 g $Y_2O_3$ powder of purity of 99.9% and 40.0 g of CuO powder of purity of 99.9%, 2.0 g of $V_2O_5$ powder of purity of 99.9% was added and crushed and mixed completely in a ball mil.

The resulting mixture was compacted in a mold and then sintered at 930° C. in air for 12.5 hours. The sintered body was pulverized and then compacted. The resulting compact was further sintered at 930° C. in air for 12 hours.

A test sample of $3 \times 3 \times 10$ mm was cut from the resulting finally sintered body and then electrodes were connected to the test sample by vacuum-depositing gold on opposite ends of the test sample according to a common technique. Electrical resistance was determined by a four probe method. Temperature was measured by a calibrated Au(Fe)-Ag thermocouple.

Phenomenon of superconductivity was observed when the test sample was cooled below 21 K. in liquidized hydrogen. Then, the temperature dependence of resistance of the test sample was determined while rising the temperature gradually. The result was that the resistance appears at 52 K. and ordinary resistance was observed above 93 K. Therefore, the critical temperature (Tcf) of this test sample was 52 K. and the onset temperature (Tc) was 93 K. The same result was observed by the measurement of AC susceptibility by L meter.

The critical current density (Jc) was also measured on a test sample prepared by the same manner as above. The Jc of 600 $A/cm^2$ was observed at 80 K. Then, the external magnetic field was increased gradually and found that Jc of 100 $A/cm^2$ was maintained in the field of 1 Tessra.

EXAMPLE 2

The same powders as Example 1 were used. In this Example 2, 5.0 g of $Ta_2O_5$ powder of purity of 99.9% was added to a mixture of 59.0 g of $BaCO_3$ powder of purity of 99.9%, 45.0 g $Y_2O_3$ powder of purity of 99.9% and 40.0 g of CuO powder of purity of 99.9% and crushed and mixed completely in a ball mil.

The resulting mixture was compacted in a mold and then sintered at 930° C. in air for 12 hours. The sintered body was pulverized in a ball mil and then compacted. The resulting compact was further sintered at 930° C. in air for 12.5 hours.

A test sample of $3 \times 3 \times 10$ mm was cut from the resulting finally sintered body and then temperature dependence of electrical resistance was determined by the same method as Example 1. The result was that the critical temperature (Tcf) of this test sample was 76 K. and the onset temperature (Tc) was 77 K., so that the discrepancy between Tcf and Tc was very small. The same result was observed by the measurement of AC susceptibility by L meter.

The critical current density (Jc) was also measured on a test sample prepared by the same manner as above. The Jc of 500 $A/cm^2$ was observed at 70 K. Then, the external magnetic field was increased gradually and found that Jc of 80 $A/cm^2$ was maintained in the field of 1 Tessra.

EXAMPLE 3

At first, powders of $BaCO_3$, $Y_2(CO_3)_3$, and CuO are mixed uniformly in such proportions that the atom ratio of Ba/(Ba+Y) is 0.4 and the atom ration of Ba/Cu is ⅔. Then, powder of $V_2O_5$ was added to the mixture with such atom ratio that V/Ba is 0.67. Then, a compact of the powder mixture was subjected to a preliminary sintering at 820° C. for 12 hours. The resulting preliminary sintered mass is pulverized and then compacted again. The resulting compacted mass is further sintered finally at 1,080° C. to obtain a target of a sintered body. Sputtering is carried out on a substrate of silicon crystal under the following conditions:

| | |
|---|---|
| Partial pressure of oxygen | $4 \times 10^{-2}$ Torr |
| Partial pressure of argon | $3 \times 10^{-2}$ Torr |
| Temperature of the substrate | 700° C. |
| Bias voltage imposed on the substrate | −60 V |
| High-frequency power | 25 $W/cm^{-2}$ |
| Distance between substrate and target | 40 mm |

A film of about 1 micron thick is obtained at a deposition rate of 3 Angstrom/sec. For comparison, the same operation as above is repeated but no oxygen is introduced into the chamber.

To determine the electric resistance of the resulting thin film, a pair of electrodes of aluminum are vacuum-deposited on a surface of the thin film at opposite ends of the surface and a pair of lead wires are soldered to the deposited aluminum electrodes.

The result was that the thin film prepared under the partial pressure of oxygen of $4 \times 10^{-2}$ Torr according to the present invention showed the onset temperature (from which superconducting phenomenon started to appear) of 90 K. and the critical temperature (at which the complete superconductor is obtained) of 50 K. On the other hand, in the comparative example in which a thin film is prepared without introducing oxygen, although the resulting thin film showed almost the same onset temperature, the electric resistance dropped rather gradually before it became zero at about 7 K. This fact revealed that introduction of oxygen into the chamber for controlling oxygen contents in the thin film during the film formation was critical to obtain a desired superconducting thin film.

The critical current density (Jc) was also measured on a test sample prepared by the same manner as above. The Jc of 2,000 A/cm² was observed at 70 K. Then, the external magnetic field was increased gradually and found that Jc of 840 A/cm² was maintained in the field of 1 Tessra.

EXAMPLE 4

At first, powders of BaCO₃, Y₂(CO₃)₃, and CuO are mixed uniformly in such proportions that the atom ratio of Ba/(Ba+Y) is 0.4 and the atom ration of Ba/Cu is ⅔. Then, powder of Ta₂O₅ was added to the mixture with such atom ration of Ta/Ba is 0.77. Then, a compact of the powder mixture was subjected to a preliminary sintering at 820° C. for 12 hours. The resulting preliminary sintered mass is pulverized and then compacted again. The resulting compacted mass is further sintered finally at 1,080° C. to obtain a target of a sintered body. Sputtering is carried out on a substrate of silicon crystal under the same conditions as Example 3.

A test sample to determine electric resistance of the resulting thin film was prepared in the same manner as Example 3.

The result was that the thin film prepared according to the present invention showed the onset temperature (from which superconducting phenomenon started to be appeared) of 76 K. and the critical temperature (at which the complete superconductor is obtained) of 75 K., so that the discrepancy between Tcf and Tc was very small.

The critical current density (Jc) of this sample was 3,000 A/cm² was observed at 70 K. and Jc of 1,000 A/cm² was maintained in the field of 1 Tessra at 70 K.

What we claim are:

1. A film of a superconducting compound oxide material represented by the general formula:

$$A_u B_v C_w Cu_x O_y$$

in which,
"A" is selected from the group consisting of magnesium (Mg), calcium (Ca), strontium (Sr) and barium (Ba);
"B" is selected from the group consisting of yttrium (Y), lanthanum (La), and lanthanide elements;
"C" is selected from the group consisting of vanadium (V), tantalum (Ta), indium (In), and thallium (Tl), and
$0 < u \leq 1.0$,
$0 < v \leq 1.0$,
$0 < w \leq 1.0$,
$0 < x \leq 1.0$, and
$2 \leq y \leq 4$, said film being deposited on a substrate by physical vapor deposition.

2. A film as claimed in claim 1, wherein "A" is magnesium.

3. A film as claimed in claim 1, wherein "A" is calcium.

4. A film as claimed in claim 1, wherein "A" is strontium.

5. A film as claimed in claim 1, wherein "A" is barium.

6. A film as claimed in claim 1, wherein "B" is yttrium.

7. A film as claimed in claim 1, wherein "B" is lanthanum.

8. A film as claimed in claim 1, wherein "B" is a lanthanide element.

9. A film as claimed in claim 1, wherein "C" is vanadium.

10. A film as claimed in claim 1, wherein "C" is tantalum.

11. A film as claimed in claim 1, wherein "C" is indium.

12. A film as claimed in claim 1, wherein "C" is thallium.

* * * * *